United States Patent [19]
Katsuoka et al.

[11] Patent Number: 5,096,677
[45] Date of Patent: Mar. 17, 1992

[54] SINGLE CRYSTAL PULLING APPARATUS

[75] Inventors: Nobuo Katsuoka, Takasaki; Koji Mizuishi, Annaka; Shinichi Furuse, Nishigo; Shigemaru Maeda, Takefu, all of Japan

[73] Assignee: Shin-Etsu Handotai Co., Ltd., Tokyo, Japan

[21] Appl. No.: 530,522

[22] Filed: May 30, 1990

[30] Foreign Application Priority Data

May 30, 1989 [JP] Japan ............... 1-134778

[51] Int. Cl.⁵ ................ C30B 35/00; C30B 15/20
[52] U.S. Cl. .................... 422/249; 422/107; 156/601; 156/617.1; 156/618.1; 156/620.4
[58] Field of Search ............... 422/107, 249; 156/601, 156/617.1, 618.1, 620.4

[56] References Cited

U.S. PATENT DOCUMENTS

| | | | |
|---|---|---|---|
| 3,621,213 | 11/1971 | Jen et al. ................... | 422/249 |
| 3,761,692 | 9/1973 | Cope ....................... | 156/601 |
| 3,998,598 | 12/1976 | Bonora ..................... | 156/617.1 |
| 4,915,775 | 4/1990 | Katsuoka et al. ........... | 156/617.1 |

FOREIGN PATENT DOCUMENTS

| | | | |
|---|---|---|---|
| 61-209988 | 9/1986 | Japan ................. | 156/617.1 |
| 63-277588 | 11/1988 | Japan ................. | 156/617.1 |
| 1-208392 | 8/1989 | Japan ................. | 422/249 |

Primary Examiner—Robert Kunemund
Attorney, Agent, or Firm—Lowe, Price, LeBlanc & Becker

[57] ABSTRACT

A Czochralski-type single crystal pulling apparatus in which the heater device is adapted to shift vertically, and a control device is provided for controlling the vertical shifting of the heater and the crucible assembly in predetermined manners, of which a preferred manner is to control the vertical shifting of the heater and the crucible assembly such that the vertical velocities of the crucible assembly and the heater are in direct proportion to the vertical velocity of the pull means.

5 Claims, 1 Drawing Sheet

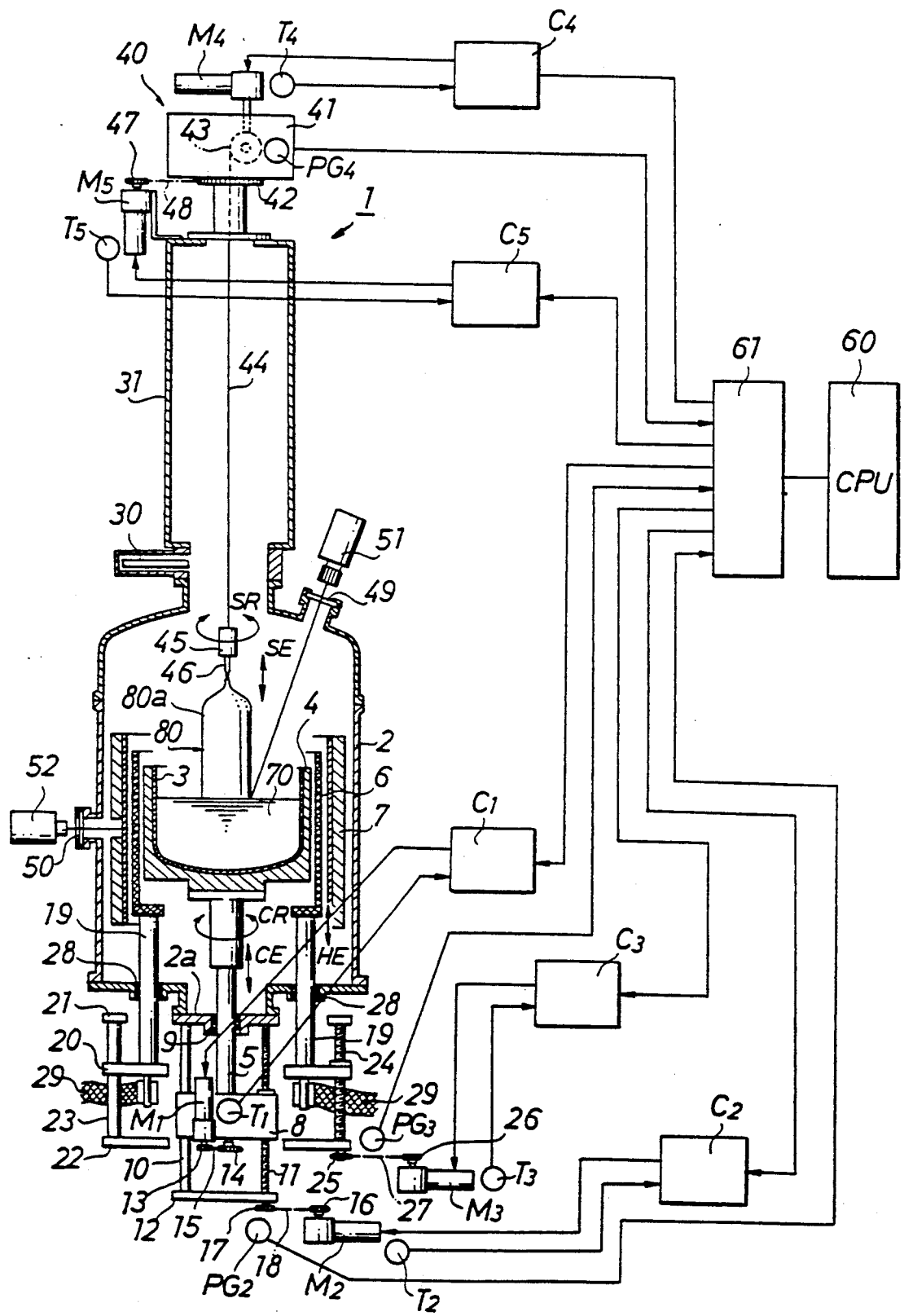

SINGLE CRYSTAL PULLING APPARATUS

The present invention relates to a single crystal pulling apparatus for pulling up a single crystal from molten liquid of a polycrystal substance based on Czonchralski method.

BACKGROUND OF THE INVENTION

A single crystal pulling apparatus of this kind consists mainly of a main chamber and a pull chamber, and in the main chamber is provided a crucible for containing the polycrystal substance (raw material) to be single-crystallized, a heater surrounding the crucible, a thermal insulator surrounding the heater, etc. The crucible is fixedly mounted on top of a coaxial vertical support shaft which is adapted to rotate about its axis. The polycrystal substance, such as silicon, charged in the crucible is melted down by the heater to turn into the polycrystal molten liquid, and in this liquid is dipped a seed crystal fixed at the lower end of a pull means which is a wire, etc. and the desired single crystal grows from the seed crystal as the pull means is rotated and raised at predetermined rates together with the seed crystal.

In such a conventional single crystal pulling apparatus, if the crucible were held and maintained at the original altitude, the melt level in the crucible would gradually shift downwards relative to the crucible wall and the heater with the growth of the single crystal, which results in an instability of the thermal condition surrounding the grown crystal and the melt.

Therefore, the support shaft is adapted to axially displace the crucible such that the displacement of the melt level (solid-liquid interface) downwards is compensated for by continuously lifting the crucible at a predetermined rate by a drive means so that the interface level is stationary relative to the heater during the crystal growth.

Incidentally, the diameter of the as-grown single crystal rod (ingot) varies depending on various conditions, of which the pulling velocity (ascending velocity of the pull means) is especially influential, so that in order to obtain a single crystal rod of a uniform diameter, it is important to continually measure the diameter of the as-grown single crystal rod (at the liquid-solid interface) and control the pulling velocity in response to the result of the measurement in a manner such that the diameter is always maintained at a predetermined value, and throughout this crystal pulling operation it is necessary to control the ascending velocity of the crucible in a predetermined proportion to the crystal pulling velocity.

However, in the conventional single crystal pulling apparatus, the heater is stationary so that when the liquid level shifts downwards relative to the crucible wall and the crucible is lifted, the positional relationship between the heater, the crucible wall and the solid-liquid interface changes, whereby the thermal effects of the heater on the solid-liquid interface changes and this typically results in lowering of the oxygen concentration in the growing single crystal. Thus, in a single crystal ingot grown in a conventional single crystal pulling apparatus, the oxygen concentration distribution is such that the oxygen concentration decreases with the growth axis. In order to compensate for the decreasing tendency of the oxygen concentration, it has been practiced to increase the rotational speed of the crucible with the progress of the growth. However, the increased rotational speed has an effect of impairing the uniformity of the oxygen concentration distribution across the cross section of the single crystal ingot.

The present invention was made in view of the above problems, and it is, therefore, an object of the invention to provide a single crystal pulling apparatus which can manufacture a single crystal ingot having uniform oxygen concentration distribution not only with respect to the growth axis but also across cross sections normal to the growth axis.

SUMMARY OF THE INVENTION

The present invention pertains to a single crystal pulling apparatus having a main chamber (2) in which are installed elements such as a vertically shiftable crucible assembly (3, 4) for containing molten liquid (70) and a heater (6) surrounding the crucible assembly, and adapted to obtain single crystal by dipping a seed crystal (46) fixed at the lower end of a pull means (44, 45) and pulling up the pull means to grow single crystal ingot from the molten liquid in the crucible assembly, characterized by that the heater is adapted to shift vertically, and by further having drive means for vertically shifting the heater and a control means for controlling the vertical shifting of the drive means and the crucible assembly.

In a preferred embodiment, the control means controls the vertical shifting of the heater and the crucible assembly in a manner such that the vertical velocities of the crucible assembly and the heater are in direct proportion to the vertical velocity of the pull means.

More preferably, the control means controls the vertical shifting of the heater and the crucible assembly in a manner such that the vertical velocities of the crucible assembly and the heater are in direct proportion to the vertical velocity of the pull means and such that the altitude of the heater is controlled based on the length of the grown single crystal.

Similarly it is preferred that the control means controls the drive means in a manner such that the vertical velocities of the crucible assembly and the heater are in direct proportion to the vertical velocity of the pull means and such that the altitude of the heater is controlled based on the time length from the start of the single crystal pulling.

According to the invention, the heater as well as the crucible assembly is adapted to shift vertically during the single crystal pulling operation, which means that the number of the control parameters has increased by one, and this enables more complicated control of the operation. As a result, the thermal balance in the main chamber, especially in the vicinity of the solid-liquid interface, can be arbitrarily controlled and stabilized, so that the oxygen concentration distribution in the axial direction of the single crystal ingot is improved in terms of uniformity.

BRIEF DESCRIPTION OF THE DRAWINGS

The single FIGURE attached hereto is a vertical longitudinal sectional drawing showing the construction of a single crystal pulling apparatus according to the invention.

EMBODIMENT

An embodiment of the invention will be described with reference to the attached FIGURE.

The figure is a cross-sectional drawing showing the construction of the single crystal pulling apparatus 1 according to the invention. Reference numeral 2 designates a main chamber (water-cooled heating chamber) comprising mainly of a stainless cylinder.

Inside the main chamber 2 is a crucible assembly which consists of an internal quartz crucible 3 and an external graphite crucible 4, and is fixed on top of a vertical support shaft 5, which is adapted to turn about its axis and shifts vertically. Surrounding these crucibles are a cylindrical heater 6 made of carbon, and a cylindrical thermal insulator 7 also made of carbon. All of these elements 3, 4, 5, 6 and 7 are in coaxial alignment.

The support shaft 5 slidably penetrates through a horizontal flange 2a fixed at the bottom of the main chamber 2, and extends vertically outside the main chamber 2. The lower portion of the shaft 5 is pivotally supported by a slider 8. Incidentally, the bore through which the support shaft 5 penetrates the flange 2a at the bottom of the main chamber 2 is lined with a seal ring 9 whereby the bore is hermetically sealed.

Three vertical guide shafts 10, extending from the flange 2a, penetrate through the slider 8. A vertical ball screw 11, extending from the flange 2a, threadably penetrates through the slider 8. A circular plate 12 is fixed at the lower ends of the guide shafts 10 and the ball screw 11. A DC servomotor $M_1$ is provided in the slider 8 for driving the crucibles 3, 4 to rotate. An endless timing belt 15 is passed round the timing pulley 13 fixed about the end of the output shaft of the DC servomotor $M_1$ and the timing pulley 14 fixed at the lower end of the support shaft 5, which extends beyond the slider 8. The element $M_2$ in the figure is a DC servomotor for causing the crucibles 3, 4 to shift vertically. An endless timing belt 18 is passed round a timing pulley 16 fixed at the end of the output shaft of the servomotor $M_2$ and a timing pulley 17 fixed at the lower end of the ball screw 11 which extends beyond the plate 12 downward. The heater 6 is supported by a pair of vertical electrodes 19, 19, which slidably penetrate the bottom of the chamber with their upper ends disposed in the chamber 2. A horizontal ring plate 20 is fixed at the lower ends of the electrodes 19. Three vertical guide shafts 23 slidably penetrate the ring plate 20, and are fixed between two stationary ring plates 21 and 22. A vertical ball screw 24 has its ends freely pivotally borne in the ring plates 21 and 22, and threadably penetrates the intermediate ring 20. A timing pulley 25 is fixed at the lower end of the ball screw 24 that extends beyond the ring plate 22 downwardly, and an endless timing belt 27 is wound around the timing pulley 25 and a timing pulley 26 fixed at the end of the output shaft of a DC servomotor $M_3$.

Incidentally, this servomotor $M_3$ is for causing the heater 6 to shift vertically. The bores through which the electrodes 19 penetrate the bottom of the chamber 2 are equipped with seal rings 28, which hermetically seal the bores.

Also, flexible lead bands 29 are connected to the lower ends of the electrodes 19 for providing electric power to the electrodes 19, and are connected at the other ends to a power source, not shown.

A pull chamber 31 is provided on top of the main chamber 2 in a coaxial alignment, and an isolation valve is provided between the two chambers 2, 31. A winder assembly 40 is provided at the top portion of the pull chamber 31. The pull chamber 31 comprises a stainless cylinder, and is for receiving in it the pulled-up grown single crystal ingot (rod), for providing a lateral exit for the ingot.

A box 41 of the winder assembly 40 is adapted to rotate horizontally relative to the pull chamber 31 together with a timing pulley 42, which is fitted on the bottom of the box 41. Provided in the box 41 is a wire winder drum 43 which is freely rotatable about its axis. A DC servomotor $M_4$ is provided above the box 41 for causing the wire winder drum 43 to rotate.

A pull wire 44 is wound round the drum 43, and a part of it is unwound to suspend vertically past the pull chamber 31 and into the heat chamber 2. A seed holder 45 is provided at the lower end of the wire 44 for holding a seed crystal 46.

A DC servomotor $M_5$ is provided at the top of the pull chamber 31 for causing the box 41 to rotate to thereby spin the wire 44 by virtue of an endless belt 48 passed around a timing pulley 47 fixed at the end of the output shaft of the servomotor $M_5$ and the timing pulley 42.

A sight glass 49 is provided in the roof of the chamber 2, and an optical diameter detecting means 51 is provided at the sight glass 49 to peep therethrough. A sight glass 50 is provided in the side wall of the chamber 2, and an optical temperature detecting means 52 is provided at the sight glass 50 to peep therethrough.

Next, the arrangement of the control system of the single crystal pulling apparatus will be described. The block 60 in the figure designates a central processing unit (CPU) which is electrically connected to a process I/O unit 61, which constitutes an interface. The process I/O unit is connected to controllers $C_1$-$C_5$ which are respectively connected to the DC servomotors $M_1$-$M_5$. Tachometers $T_1$-$T_5$ are provided for respective DC servomotors $M_1$-$M_5$ for detecting the rotational speed thereof, and are electrically connected to the respective controllers $C_1$-$C_5$.

The single crystal pulling apparatus 1 also includes pulse generators $PG_2$, $PG_3$, $PG_4$ for detecting the rotational speeds of the ball screws 11, 24, and the wire winder drum 43, respectively. These pulse generators $PG_2$, $PG_3$, $PG_4$ are electrically connected to the CPU 60 by way of the process I/O unit 61, as shown in the figure.

Next, the operation of the single crystal pulling apparatus will be described.

At the beginning of the single crystal pulling operation, the isolation valve 30 is opened to thereby render the main chamber 2 and the pull chamber 31 into communication. Then, an inert gas such as Ar gas is supplied into the main chamber 2, and the single crystal pulling operation is carried out in this inert gas atmosphere.

Polycrystal raw material such as silicon is charged in the crucible 3 wherein it is melted by the heater 6 to form a molten liquid 70. The pulling starts as the motor $M_4$ drives the wire winder drum 43 to turn in the direction of unwinding the pull wire 44. Thus, the wire 44 is lowered gradually, and the seed crystal 46 fixed at the lower end of the wire 44 is dipped in the molten liquid 70 contained in the crucible 3.

Next, the motor $M_1$ is started, and its torque is transmitted to the support shaft 5 by way of the pulley 13, the timing belt 15, and the pulley 14, whereupon the support shaft 5 and the crucibles 3, 4 supported thereon are caused to rotate about their common axis of rotation at a predetermined rate CR.

Simultaneously with this, the motors $M_4$ and $M_5$ are started. The torque of the motor $M_4$ is transmitted to and causes the wire winder drum 43 to turn and wind up the pull wire 44 at a predetermined velocity SE. The torque of the motor $M_5$ is transmitted, via the pulley 47, the timing belt 48, and the pulley 42, to and causes the box 41 of the winder assembly 40 to turn around its rotation axis. Thus, the pull wire 44 also spins together with the box 41 at a predetermined rate of SR. As a result, the pull wire 44 rises and spins at the same time, and a single crystal rod 80 grows from the seed crystal 46 provided at the end of the pull wire 44, as shown in the figure.

Incidentally, as the single crystal pulling operation proceeds, the level of the molten liquid 70 shifts downward relative to the wall of the crucible 3, and in order to maintain the level of the molten liquid 70 unchanged relative to the chamber 2, the crucibles 3, 4 are raised at a predetermined velocity CE. In particular, the motor $M_2$ is started and its torque is transmitted, via the pulley 16, timing belt 18 and pulley 17, to and causes the ball screw shaft 11 to turn in a direction such that the slider 8 rises along the guide shafts 10, whereby the support shaft 5 supported by the slider 8 and the crucibles 3, 4 mounted on the support shaft rise at the predetermined velocity CE.

In the present embodiment, the heater 6 is also shifted vertically (downwardly) at a predetermined velocity HE during the single crystal pulling operation. In particular, the motor $M_3$ is started and its rotational torque is transmitted, via the pulley 26, the timing belt 27, and the pulley 25, to and causes the ball screw shaft 24 to turn in a direction such that the plate 20 shifts downwardly along the guide shafts 23, whereby the electrodes 19, 19 supported by the plate 20 and the heater 6 descend at the predetermined velocity of HE.

According to the present embodiment of the invention, during that stage of the single crystal pulling operation in which the cylindrical portion 80a of the single crystal ingot 80 is raised from the molten liquid 70 (cylindrical portion pulling stage), the pulling velocity SE and the spinning rate SR of the wire 44, the vertical velocity CE and the rotational speed CR of the crucibles 3, 4, and the vertical velocity HE of the heater 6 are controlled in the following manner.

The control pattern for the rotational speed SR of the wire 44 and the rotational speed CR of the crucibles 3, 4 is programmed with respect to the pull-up length l of the single crystal, and this pattern is stored in the CPU 60 beforehand. The rotational speed of the wire winder drum 43 detected by the pulse generator PG4 is supplied to the CPU 60, which computes the pull-up length l of the single crystal based on the supplied data.

Accordingly, the CPU-stored values corresponding to the computed pull-up length l are supplied to the controllers $C_5$ and $C_1$ by way of the process I/O unit 61, and the controllers $C_5$ and $C_1$ control the motors $M_5$ and $M_1$ in a manner such that the respective differences between the corresponding CPU-stored values and the actual values calculated from the rotational speeds detected by the tachometers $T_5$ and $T_1$ approach zero.

The control pattern for the pull-up velocity SE of the wire 44 is also programmed principally based on the pull-up length l of the single crystal, and this program data are stored in the CPU 60 beforehand. The CPU-stored value of the pull-up velocity SE corresponding to the current pull-up length l is supplied to the controller $C_4$, which in turn controls the motor $M_4$ in a manner such that the difference between the corresponding CPU-stored value and the actual value calculated from the rotational speed detected by the tachometer $T_4$ approaches zero.

However, the actual pull-up velocity SE is controlled to a value slightly different from said CPU-stored value due to the regulation by the control system for controlling the diameter of the single crystal ingot 80.

The vertical shifting of the crucibles 3, 4 and the heater 6 is interrelated to the vertical shifting of the wire 44, and the vertical velocity CE of the crucibles 3, 4 and the vertical velocity HE of the heater 6 are controlled such that CE and HE are in direct proportion to the pull-up velocity SE of the wire 44 (By-Velocity Determining Method). In other words, the vertical velocities CE, HE are obtained by multiplying the pull-up velocity SE of the wire 44 with respective predetermined coefficients. The thus obtained values CE and HE are outputted from the CPU 60 and supplied to the controllers $C_2$, $C_3$ via the process I/O unit 61, and said controllers control the motors $M_2$, $M_3$ in a manner such that the respective differences between the values CE and HE and the actual values calculated from the rotational speeds detected by the tachometers $T_2$, $T_3$ approach zero.

By thus controlling the vertical velocity CE of the crucibles 3, 4, the level of the molten liquid 70 in the crucible 3 is kept at a fixed height. Also, since vertical velocity HE of the heater 6 is similarly controlled, the oxygen concentration distribution in the axial direction of the single crystal ingot 80 is improved in terms of uniformity.

Incidentally, a method exists for controlling the altitude HP of the heater 6 based on the pull-up length l of the single crystal (Position Determination Method). According to this method, the actual position of the heater 6 is computed by means of the CPU 60 based on the value detected by the pulse generator $PG_2$, and the controller $C_2$ controls the motor $M_2$ in a manner such that the difference between this actual position and the CPU-stored predetermined position diminishes.

Through employment of a control method such as this, it is possible to conduct a more sophisticated controlling in response to the temperature distribution in the direction of the height of the heater 6, for example.

According to this embodiment of the invention, the heater 6 as well as the crucibles 3, 4 is adapted to shift vertically during the single crystal pulling operation, so that it is possible to conduct a more complicated control of the operation. As a result, the thermal balance in the main chamber, especially in the vicinity of the solid-liquid interface, can be controlled in a manner that the oxygen concentration distribution in the axial direction of the single crystal ingot is improved in terms of uniformity.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A single crystal pulling apparatus having a main chamber containing elements such as a vertically shiftable crucible assembly for containing molten liquid and a heater surrounding the crucible assembly, said single crystal pulling apparatus being adapted to obtain a single crystal by dipping a seed crystal fixed at a lower end of a pull means and pulling up the pull means so that a single crystal is grown at a tip of the seed crystal from the molten liquid in said crucible assembly, characterized in that said heater is adapted to be shifted vertically by a drive means for vertically shifting said heater, said drive means being controlled by a control means to simultaneously move vertically said heater and said crucible assembly.

2. A single crystal pulling apparatus as claimed in claim 1 wherein said control means controls the vertical shifting of said heater and said crucible assembly in a predetermined relation to a vertical shifting of said pull means.

3. A single crystal pulling apparatus as claimed in claim 2 wherein said control means controls the vertical shifting of said heater and said crucible assembly in a manner such that vertical velocities of the crucible assembly and the heater are in direct proportion to a vertical velocity of the pull means.

4. A single crystal pulling apparatus as claimed in claim 1 wherein said control means controls the vertical shifting of said heater and said crucible assembly in a manner such that vertical velocities of the crucible assembly and the heater are in direct proportion to a vertical velocity of the pull means and such that a vertical position of the heater is controlled based on a length of the grown single crystal.

5. A single crystal pulling apparatus as claimed in claim 1 wherein said control means controls the vertical shifting of said heater and said crucible assembly in a manner such that vertical velocities of the crucible assembly and the heater are in direct proportion to a vertical velocity of the pull means and such that a vertical position of the heater is controlled based on a time lapse measured from the start of the single crystal pulling.

* * * * *